(12) United States Patent
Schmidt

(10) Patent No.: US 10,934,016 B2
(45) Date of Patent: Mar. 2, 2021

(54) PROTECTIVE SHIELD INCLUDING HYBRID NANOFIBER COMPOSITE LAYERS

(71) Applicant: UNITED TECHNOLOGIES CORPORATION, Farmington, CT (US)

(72) Inventor: Wayde R. Schmidt, Pomfret Center, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 1007 days.

(21) Appl. No.: 15/375,229

(22) Filed: Dec. 12, 2016

(65) Prior Publication Data

US 2018/0162547 A1 Jun. 14, 2018

(51) Int. Cl.
| | | |
|---|---|---|
| *B64D 45/00* | (2006.01) | |
| *B05D 1/04* | (2006.01) | |
| *B05D 5/00* | (2006.01) | |
| *B05D 3/12* | (2006.01) | |
| *B05D 3/04* | (2006.01) | |

(Continued)

(52) U.S. Cl.
CPC ............... *B64D 45/00* (2013.01); *B05D 1/04* (2013.01); *B05D 3/0473* (2013.01); *B05D 3/12* (2013.01); *B05D 5/00* (2013.01); *C04B 35/62227* (2013.01); *C04B 35/62281* (2013.01); *D01D 5/0007* (2013.01); *D01F 1/09* (2013.01); *D01F 1/10* (2013.01); *D01F 9/00* (2013.01); *H05K 9/0007* (2013.01); *H05K 9/0081* (2013.01); *B64D 45/02* (2013.01); *B82Y 30/00* (2013.01); *C04B 2235/327* (2013.01); *C04B 2235/3272* (2013.01); *C04B 2235/40* (2013.01); *C04B 2235/405* (2013.01); *C04B 2235/48* (2013.01); (Continued)

(58) Field of Classification Search
CPC ........... B64D 45/00; B64D 45/02; D01F 1/09; D01D 5/0007; C04B 35/62227; C04B 35/62281
See application file for complete search history.

(56) References Cited

U.S. PATENT DOCUMENTS

| | | |
|---|---|---|
| 4,566,990 A | 1/1986 | Liu et al. |
| 4,596,670 A | 6/1986 | Liu |

(Continued)

OTHER PUBLICATIONS

Chen I H et al: "Fabrication and characterization of magnetic cobalt ferrite/polyacrylonitrile and cobalt ferrite/carbon nanofibers by electrospinning", Carbon, Elsevier, Oxford, GB, vol. 48, No. 3, Mar. 1, 2010 (Mar. 1, 2010), pages 604-611, published online on Sep. 24, 2009.

(Continued)

*Primary Examiner* — Jared Fureman
*Assistant Examiner* — Christopher J Clark
(74) *Attorney, Agent, or Firm* — Carlson, Gaskey & Olds, P.C.

(57) ABSTRACT

A method of forming a protective shield to protect an aircraft component from EMI or energy bursts includes the steps of combining a carbon-based or silicon-based preceramic polymer precursor and a metallic precursor to form a dope, processing the dope to provide a deposit that includes nano-structures, post-processing the deposit to provide a nano-structure material with a uniformly distributed base metal or metal compound, and forming a protective shield using the nano-structure material.

28 Claims, 2 Drawing Sheets

(51) Int. Cl.
*D01D 5/00* (2006.01)
*D01F 1/09* (2006.01)
*C04B 35/622* (2006.01)
*B64D 45/02* (2006.01)
*H05K 9/00* (2006.01)
*D01F 9/00* (2006.01)
*D01F 1/10* (2006.01)
*B82Y 30/00* (2011.01)

(52) U.S. Cl.
CPC .............. *C04B 2235/483* (2013.01); *C04B 2235/5264* (2013.01)

(56) References Cited

U.S. PATENT DOCUMENTS

| | | | |
|---|---|---|---|
| 5,250,342 | A | 10/1993 | Lang et al. |
| 5,288,519 | A | 2/1994 | Baumgartner et al. |
| 5,302,467 | A | 4/1994 | Baumgartner et al. |
| 5,504,274 | A | 4/1996 | McCabe et al. |
| 6,399,737 | B1 | 6/2002 | Elkovitch |
| 7,301,109 | B2 | 11/2007 | Chen |
| 7,790,135 | B2 | 9/2010 | Lennhoff |
| 8,222,321 | B2 | 7/2012 | Youm et al. |
| 2005/0239948 | A1 | 10/2005 | Haik et al. |
| 2007/0265379 | A1* | 11/2007 | Chen ............ B82Y 30/00 524/404 |
| 2008/0057265 | A1* | 3/2008 | Liang ............ B32B 5/02 428/114 |
| 2008/0199685 | A1 | 8/2008 | Bortner et al. |
| 2010/0311866 | A1* | 12/2010 | Huang ............ C08K 7/24 523/137 |
| 2012/0295097 | A1* | 11/2012 | Lotus ............ D01D 5/0007 428/317.9 |
| 2014/0332733 | A1* | 11/2014 | Joo ............ D04H 1/4234 252/513 |
| 2015/0247263 | A1* | 9/2015 | Joo ............ D01F 9/10 252/71 |
| 2016/0059517 | A1 | 3/2016 | Dhakate et al. |
| 2016/0099498 | A1* | 4/2016 | Pance ............ H01F 1/0551 343/787 |
| 2016/0319471 | A1* | 11/2016 | Lee ............ D06M 11/83 |

OTHER PUBLICATIONS

Hui Wu et al: "Electrospinning of ceramic nanofibers: Fabrication, assembly and applications", Journal of Advanced Ceramics, vol. 1, No. 1, Mar. 1, 2012 (Mar. 1, 2012), pp. 2-23.

Hye Ji Im et al: "Enhanced electromagnetic interference shielding behavior of Graphene Nanoplatelet/Ni/Wax nanocomposites", Journal of Materials Chemistry C: Materials for Optical and Electronic Devices, vol. 5, No. 26, Jan. 1, 2017 (Jan. 1, 2017), pp. 6471-6479.

Ping Lu et al: "Synthesis of Nickel Nanoparticles Supported on Nanoporous Silicon Oxycarbide (SiCO) Sheath-Core Fibers", Journal of Physical Chemistry C, vol. 114, No. 27, Jun. 18, 2010 (Jun. 18, 2010), pp. 11776-11782.

Yejun Qiu et al: "Large-Scale Production of Aligned Long Boron Nitride Nanofibers by Multijet/Multicollector Electrospinning", Journal of Physical Chemistry C, vol. 113, No. 26, Jun. 4, 2009 (Jun. 4, 2009), pp. 11228-11234.

Li D et al: "Electrospinning of Polymeric and Ceramic Nanofibers as Uniaxially Aligned Arrays", Nano Letters, American Chemical Society, vol. 3, No. 8, Aug. 1, 2003 (Aug. 1, 2003), pp. 1167-1171.

Ning Li et al: "Electromagnetic Interference (EMI) Shielding of Single-Walled Carbon Nanotube Epoxy Composites", Nano Letters, vol. 6, No. 6, Jun. 1, 2006 (Jun. 1, 2006), pp. 1141-1145.

Extended Search Report for European Application No. 17206764.7, dated May 12, 2018.

* cited by examiner

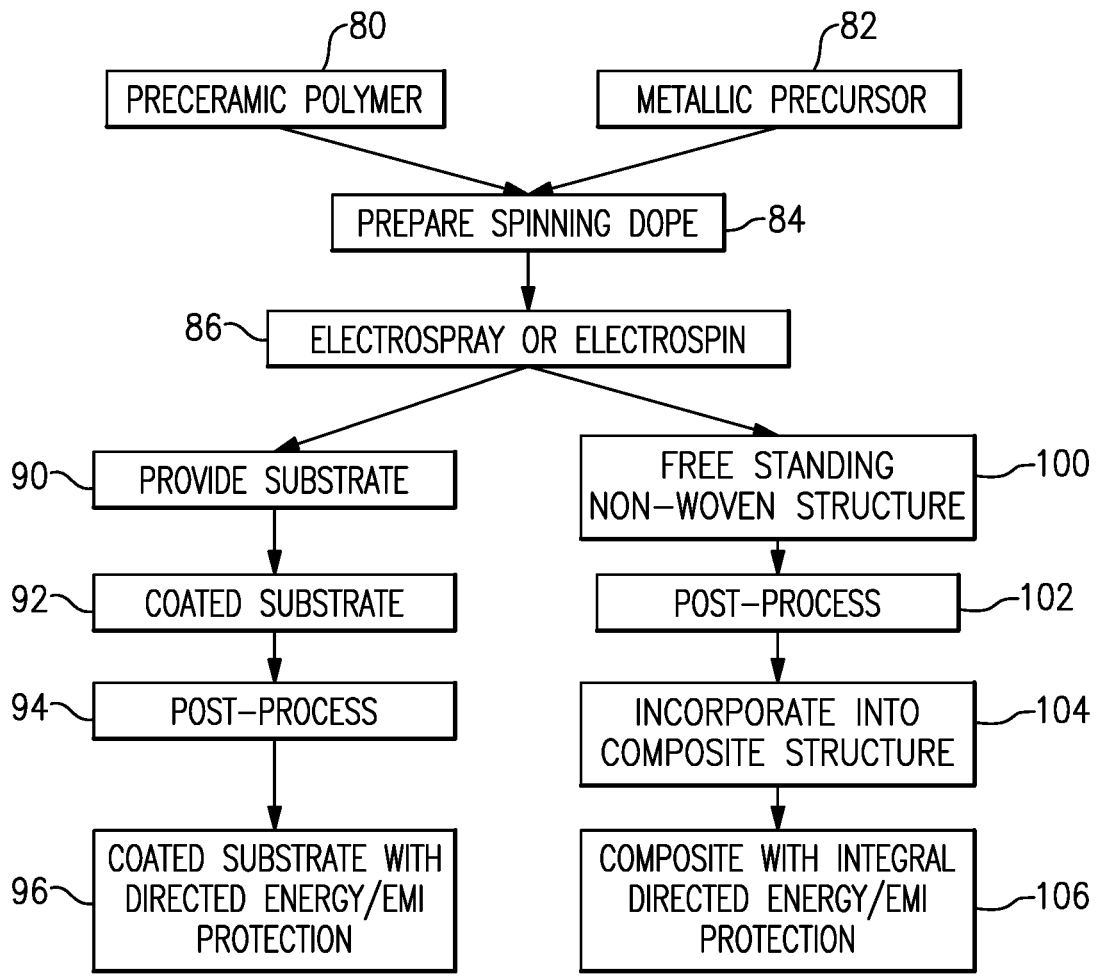

US 10,934,016 B2

PROTECTIVE SHIELD INCLUDING HYBRID NANOFIBER COMPOSITE LAYERS

BACKGROUND OF THE INVENTION

A gas turbine engine includes many different electronic components and communication devices that can be susceptible to electromagnetic interference (EMI) and other types of intense energy conditions. EMI and intense energy bursts, such as that generated by lightning for example, can adversely affect the operation of electronic components and communication devices by causing current fluctuation, circuit overloading, communication disruptions, etc.

It is desirable to protect aircraft structures, internal electronic components, and communication devices from EMI and energy bursts such that the aircraft can operate efficiently even when subject to extreme operating conditions. Existing protection solutions utilize fine metal meshes and electrically conductive composites to form EMI shields. While these types of materials have been able to provide the desired EMI protection, they are disadvantageous from size and weight aspects. Further, shields made from these types of materials are difficult to incorporate during manufacturing processes. Thus, a more lightweight and efficient solution is needed to protect components from EMI and energy bursts.

SUMMARY OF THE INVENTION

In a featured embodiment, a method of forming a protective shield to protect an aircraft component from EMI or energy bursts includes the steps of combining a carbon-based or silicon-based preceramic polymer precursor and a metallic precursor to form a dope, processing the dope to provide a deposit that includes nano-structures, post-processing the deposit to provide a nano-structure material with a uniformly distributed base metal or metal compound, and forming a protective shield using the nano-structure material.

In another embodiment according to the previous embodiment, the preceramic polymer precursor is an inorganic polymer In another embodiment according to any of the previous embodiments, the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof.

In another embodiment according to any of the previous embodiments, the metallic precursor is a ferromagnetic metal or alloy.

In another embodiment according to any of the previous embodiments, the ferromagnetic metal is nickel, cobalt, iron, alloys of nickel, cobalt, or iron, rare earth alloys, or ferritic metal oxides.

In another embodiment according to any of the previous embodiments, the nano-structures comprise nanofibers, nanoparticulates, and/or beaded nanofibers.

In another embodiment according to any of the previous embodiments, the preceramic polymer precursor includes carbon-based fibers.

In another embodiment according to any of the previous embodiments, a substrate is provided and the dope is processed by electrospraying, which comprises depositing a coating with the nano-structures on the substrate. Post-processing includes using one or more of heat, pressure, atmosphere, and radiation to convert the carbon- or silicon-based polymer precursors to a final desired form in the nano-structure material such that the protective shield is provided as a coated substrate with directed energy and EMI protection.

In another embodiment according to any of the previous embodiments, the dope is processed by electrospinning, which is performed to prepare a nonwoven mat. Post-processing includes using one or more of heat, pressure, atmosphere, and radiation to convert the precursors to a final desired form in the nano-structure material of the nonwoven mat.

In another embodiment according to any of the previous embodiments, the nano-structure material is incorporated into a composite structure to provide the protective shield as a composite with integral directed energy and EMI protection.

In another featured embodiment, a protective shield to protect an aircraft component from EMI or energy bursts has a shield body comprising a coated substrate or an integrated composite formed from a nano-structure material that includes a uniformly distributed base metal.

In another embodiment according to any of the previous embodiments, the nano-structures are nanofibers, nanoparticulates, and/or beaded nanofibers.

In another embodiment according to any of the previous embodiments, the nano-structures are electrospun or electrosprayed nano-structures.

In another embodiment according to any of the previous embodiments, the nano-structure material is formed from a dope formed from a combination of a carbon-based or silicon-based preceramic polymer precursor and a metallic precursor.

In another embodiment according to any of the previous embodiments, the preceramic polymer precursor is an inorganic polymer, and wherein the metallic precursor is a ferromagnetic metal or alloy.

In another embodiment according to any of the previous embodiments, the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof and wherein the magnetic metal is nickel, cobalt, iron, alloys of nickel, cobalt, or iron, rare earth alloys, or ferritic metal oxides In another featured embodiment, an aircraft component has a housing and at least one electrical component at least partially enclosed within the housing. A protective shield to protect the electrical component from EMI or energy bursts, wherein the protective shield comprises a shield body comprising a coated substrate or an integrated composite formed from a nano-structure material that includes a uniformly distributed base metal.

In another embodiment according to any of the previous embodiments, the nano-structures are electrospun or electrosprayed nano-structures.

In another embodiment according to any of the previous embodiments, the nano-structure material is formed from a dope formed from a combination of a carbon-based or silicon-based preceramic polymer precursor and a metallic precursor, and wherein the silicon-based preceramic polymer precursor is an inorganic polymer, and wherein the metallic precursor is a ferromagnetic metal or alloy.

In another embodiment according to any of the previous embodiments, the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof and wherein the magnetic metal is nickel, cobalt, iron, alloys of nickel, cobalt, iron, rare earth alloys, or ferritic metal oxides.

The foregoing features and elements may be combined in any combination without exclusivity, unless expressly indicated otherwise.

These and other features may be best understood from the following drawings and specification.

BRIEF DESCRIPTION OF THE DRAWINGS

FIG. 2 is a schematic representation of an aircraft component comprising an electrical component that is protected by a shield incorporating the subject invention.

FIG. 3 is a flowchart indicating steps used for manufacturing a protective shield from a nano-structure material incorporating the subject invention.

DETAILED DESCRIPTION

Figure 1:
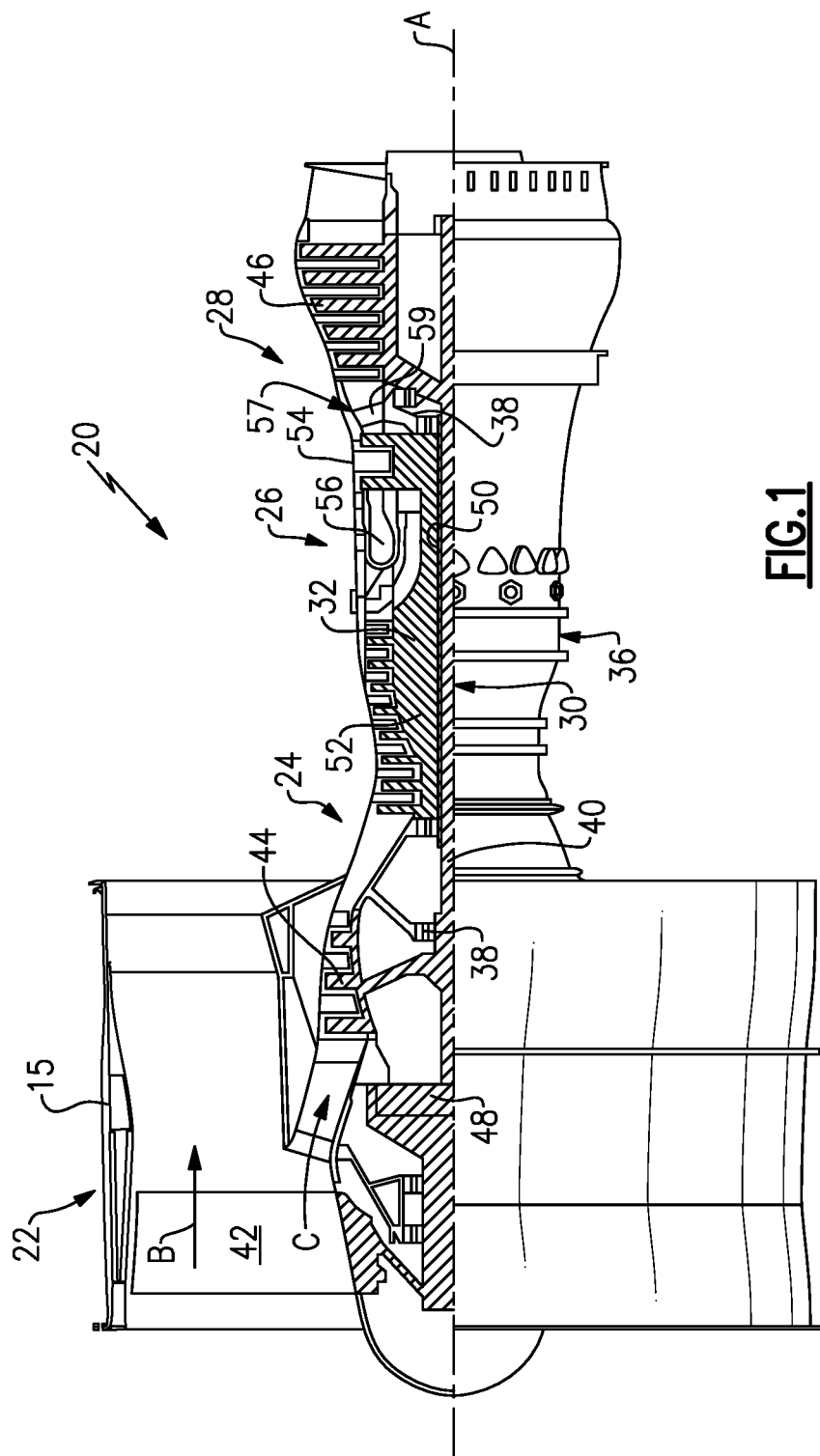
FIG. 1 is a schematic representation of one example of a gas turbine engine.

FIG. 1 schematically illustrates an exemplary gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct defined within a nacelle 15, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a second (or high) pressure compressor 52 and a second (or high) pressure turbine 54. A combustor 56 is arranged in exemplary gas turbine 20 between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet. The flight condition of 0.8 Mach and 35,000 ft, with the engine at its best fuel consumption—also known as "bucket cruise Thrust Specific Fuel Consumption ('TSFC')"—is the industry standard parameter of (pound-mass) lbm of fuel being burned divided by (pound-force) lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °R)/(518.7°\ R)]^{0.5}$. The "low corrected fan tip speed" as disclosed herein according to one non-limiting embodiment is less than about 1150 ft/second.

FIG. 2 is a schematic representation of an aircraft component 70 that comprises a housing 72 that at least partially encloses an electronic component 74. A protective shield 76 is provided to protect the electrical component 74 from EMI or other types of energy bursts. The protective shield 76 is comprised of a material that includes silicon-containing or carbonaceous nanofibers that are hybridized with a metal-based phase to form a protective composite layer or coated substrate. One objective of this disclosure is to provide a protective shield 76 that provides electrical conductivity, thermal conductivity and magnetic functionality to protect the electrical component 74.

The process for forming the composite layer or coated substrate includes fabricating and deploying solution or melt electrospun/electrosprayed silicon-containing, e.g. silicon carbide (SiC) nanofibers or carbonaceous nanofibers, e.g. polyacrylonitrile (PAN) nanofibers, that are then hybridized by the inclusion of a ferromagnetic phase, e.g. ferritic metal oxides; nickel (Ni), cobalt (Co), or iron (Fe), or their alloys, other alloys of rare earth metals, cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb) and yttrium (Y), etc., that is incorporated into the precursor dope as nanoparticles (spheres, rods, etc., for example) as well as metal-based salts or precursors intended to be converted post-fiber formation. With controlled conversion (thermal, radiative, ultraviolet (UV), etc.), composite nanofibers are formed with homogeneously dispersed ferromagnetic phases. These nanofibers can then be readily formed to create veils, scrims, mats, etc. of well-dispersed fibers in a separate operation, or the nanofibers can be deposited directly as a nanofiber network onto the composite structure of the subject component 70. This process will integrate the nanofiber material (silicon-containing or carbonaceous fiber including metal-based phases) in the final desired structure to provide the necessary protection layer against EMI and high energy pulses or bursts.

FIG. 3 shows a flowchart of an example method of forming a hybrid nano-structure material. The schematic flow chart gives an overall view of the process options. In general, a carbon-based or preceramic polymer precursor 80 and a metallic precursor 82 are initially combined to form a dope as indicated at 84. Any suitable solvent(s) can be used to dissolve the carbon-based or preceramic polymer precursor 80 and metallic precursor 82. In one example, the carbon-based polymer 80 is a polyacrylonitrile (PAN) homopolymer, a PAN copolymer, a cellulosic polymer or a pitch polymer. In one example, the preceramic polymer precursor 80 is an inorganic polymer containing silicon (Si) covalently bonded in the backbone chain, e.g. a polycarbosilane; however, other polymer types could also be used (polysilazanes, polysiloxanes, polycarbosilazanes, polycarbosiloxanes, polysilsesquioxanes, as well as metal-modified polymers of carbosilanes, silazanes, siloxanes, carbosilazanes, carbosiloxanes, and combinations thereof, etc.). In one example, the metallic precursor 82 includes nickel (Ni), cobalt (Co), iron (Fe), or other known ferromagnetic metals or combinations of ferromagnetic metal alloys. Mixtures of one or more carbon-based and one or more preceramic polymers with metallic precursor(s) are also contemplated.

The dope is then subjected to a step 86 of electrospinning or electrospraying using methods known in the art, e.g. a high voltage potential applied between one or more extrusion nozzles, needles or orifices and the substrate, for example. In one example, the substrate is stationary. In other examples, the substrate can be positioned on a rotary stage or a translational stage (capable of x, y or z movement) or both. The resulting material for step 86 comprises a nano-structure material that is comprised mostly of nanofibers, nanoparticulate, beaded nanofibers or other geometries demonstrated in the art of electrospinning/spraying. Nano-structures in this material are all experimentally controllable by modifying voltage, dope concentration, molecular weight of polymer precursors, delivery rate, additive presence and concentration, deposition rig geometry, nozzle geometry, number and location relative to one another, temperature, atmosphere/relative humidity, fluid viscosity and surface tension, etc. as known in the art. Nanofibers in the nano-structure are generally considered to have diameters between 5 to 1000 nanometers; preferably between 20 to 750 nanometers and more preferably between 50 to 500 nanometers. Ideally the distribution of nanofiber diameters within the network falls within +/−25% of the mean nanofiber diameter. The nanofibers can have an aspect ratio of at least 10:1, preferably at least 100:1 and more preferably at least 1000:1. Nanoparticulates within the nano-structure are generally considered to have at least one dimension (i.e. average diameter) between 1 to 250 nanometers; preferably below 100 nanometers. The morphology or shape of the nanoparticulate can be acicular, rod-like, spherical, etc. The aspect ratio of the nanoparticulate preferably ranges from about 1 to about 250. Particle size distributions are preferably uniform.

Preferable formulations of spinning dope comprising blends of carbon- or preceramic polymer-based to metallic precursor-based components range from about 50/50 to about 99/1 by weight percent of the precursors, more preferably from about 75/25 to about 95/5 weight percent. Preferable weight percentage ranges in the final product are about 75/25 to about 99/1, more preferably from about 90/10 to 99/1 weight percent of carbon- or silicon-based nano-structure to magnetic nano-structure. In one example, it is desirable to create a random distribution of deposited nanofibers. In another example, it is desirable to control the growth rate and relative size of the magnetic particles, as well as their spatial distribution. In yet another example, it is preferable to increase the orientation of the nanofiber network, as might be needed to direct absorbed energy during the EMI shielding or lightning event away from certain electronic components 74. Increased orientation of the hybrid nanofibers can be performed by moving the substrate relative to the delivery nozzles or by varying the relative position of the electrodes used to create the nanofibers. In another example, it is desirable to locally concentrate the magnetic phase to enhance the relative magnetic strength of portions of the hybrid nanofiber mat. In this case, the presence of beads within the nanofiber mat is desirable and can be controlled using the experimental parameters noted above, but most importantly metallic precursor concentration as well as surface tension and viscosity of the starting dope.

When using the electrospray process, a substrate 90 is provided. The electrospraying process then deposits a coating of the nano-structure material on the substrate to provide a coated substrate 92. Post-processing steps, indicated at 94, are then performed to provide a final product 96 comprising a coated substrate with directed energy and EMI protection.

When using the electrospinning process, a nonwoven mat layer or series of layers is prepared using the nano-structure material as indicated at 100. The nano-structure material can be deposited directly onto a stationary or nonstationary substrate or can be deposited on a temporary or sacrificial substrate, which can then be removed leaving behind a free standing nonwoven structure. Post-processing steps, indicated at 102, are then performed and the nonwoven structure is incorporated into a composite structure as indicated at 104. The resulting final product 106 comprises a composite with integral directed energy and EMI protection.

It is also contemplated that a combination of electrospray and electrospinning processes can be used. In one example, the electrospray process can be used to form one or more layers and the electrospinning process can be used to form one or more layers. The electrosprayed and electrospun layers can then be stacked in any desired order, and in any desired combination of electrosprayed/electrospun layers, to form the final product. It is also contemplated that the final product could be comprised of a hybrid nanofiber network which contains carbon-based or preceramic polymer network as well as an independent network of Fe- Co- or Ni-based nanofibers.

Once the nano-structure material is formed using the electrospraying or electrospinning process, the electrospun/sprayed nano-structure material is subjected to post-processing to form the desired final material structure. For example, the nano-structure material can be further processed via a combination of one or more of heat, atmosphere, pressure, radiation, etc. to convert the carbon-based or preceramic polymer precursor 80 and metallic precursor 82 into their final desired forms, composition, crystallinity, etc. In one example, if the preceramic polymer precursor 80 is a polycarbosilane precursor to SiC, the resulting polycarbosilane nanofiber can be heat treated to temperatures greater than 600 degrees Celsius in a non-oxidizing atmosphere for a suitable time to convert the precursor-based nanofiber into a SiC-containing nanofiber. The extent of crystallinity and crystal size of the SiC-containing nanofiber can be further increased with additional exposure to temperatures above 600 degrees Celsius and for extended times as known in the art.

In another example, if the carbon-based precursor contains an additive suitable for photochemical curing (i.e. UV exposure), then the precursor/additive mixture can be electrosprayed/spun onto a substrate then exposed to UV radiation to induce crosslinking of the structure (i.e. nanofiber mat or coating or a combination) to rigidize the structure for subsequent handling. The resulting structure could then be exposed to thermal treatment (i.e. heating to greater than 900 degrees Celsius in an inert atmosphere) to convert the original structure to a carbonaceous structure. In one example, the carbonaceous structure includes amorphous networks of covalently bonded carbon in a combination of sp2 and sp3 hybridization. In other examples, the carbonaceous structure is partially crystalline, turbostratic, fully crystalline, glassy or combinations of these. In other examples the carbonaceous material comprises planar graphene layers that are generally parallel to one another, yet do not include carbon nanotubes. In still other examples the carbon in the structure is generally graphitic in nature. In one example, the ferromagnetic metallic precursor is provided as a solid metal compound such as oxides of iron, nickel or cobalt. In another example, the ferromagnetic precursor is a soluble source of metal ions, e.g. $Fe^{3+}/Fe^{4+}$. When metal ions are present, an exemplary way to process the electrospun nanofiber is to briefly heat the nanofiber in an oxidizing atmosphere at a temperature and time sufficient to oxidize the metal ion to ferromagnetic oxide, e.g. $Fe^{3+}/Fe^{4+}$ precursor oxidizing to $Fe_3O_4$ phase dispersed within the polymer-derived nanofiber. (These metal oxides have not been claimed but are known to be good EMI absorbers.)

Metal sources (metallic precursors) can also include salts of iron, cobalt, nickel, or combinations thereof. Examples of salts are nitrates, sulfates, sulfites, phosphates, chlorides, phosphites, chromates, citrates, acetates, fluorides, or the like, or combinations thereof. The salts can be dissolved in a suitable solvent and initially mixed with the carbon-based or silicon-based preceramic source(s). The mixture is then subjected to a reducing atmosphere (e.g., hydrogen) at temperatures of 150 to 300° C. to convert the metal salt to a metal prior to further post-processing to form the nanofibers.

By initially mixing the metal source(s) with the carbon-based or silicon-based preceramic source(s), the metal(s) will be initially homogeneously distributed at the atomic/molecular level.

Upon suitable post-processing, this metal can be selectively reduced, oxidized or concentrated (or the metallic precursor selectively converted) to provide a generally uniformly distributed base metal or desired ferromagnetic phase(s) within the carbon-containing or silicon-containing nanofiber. In this manner, the resulting material that includes a carbon-based or silicon-based nonwoven nanofiber network is sufficiently electrically conductive to provide protection against directed energy and/or to provide EMI shielding, while the magnetic metal can provide additional magnetic functionality to the resulting structure.

The subject invention provides several benefits compared with prior protective configurations. The nano-structure material formed by the process described above has an extremely low weight and thickness, which is preferential over traditional metal meshes which are heavy and bulky. Multiple layers of the nano-structure material can be used together, can be used as a coating, or can be used in distributed arrays within other composite prepreg layups to form an integrated composite. The nano-structure material can be applied as a scrim cloth or can be embedded deeper within a multi-layered structure. The subject invention combines a fibrous conductive network with magnetic functionality on a nanoscale basis. This provides highly customizable fiber size, density, composition and filler composition, as well as customizable shield size and functionality.

Although embodiments of this invention have been disclosed, a worker of ordinary skill in this art would recognize that certain modifications would come within the scope of this invention. For that reason, the following claims should be studied to determine the true scope and content of this invention.

The invention claimed is:

1. A method of forming a protective shield to protect an aircraft component from EMI or energy bursts comprising the steps of:
   combining a carbon-based or silicon-based preceramic polymer precursor and a metallic precursor to form a dope;
   processing the dope to provide a deposit that includes nano-structures;
   post-processing the deposit to provide a nano-structure material with a uniformly distributed base metal or metal compound; and
   forming a protective shield using the nano-structure material, and wherein a weight percentage range in the protective shield is about 75/25 to about 99/1 weight percent of carbon-based or silicon-based nano-structure to magnetic nano-structure.

2. The method according to claim 1 wherein the preceramic polymer precursor is an inorganic polymer.

3. The method according to claim 2 wherein the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof.

4. The method according to claim 1 wherein the metallic precursor is a ferromagnetic metal or alloy.

5. The method according to claim 4 wherein the ferromagnetic metal is nickel, cobalt, iron, alloys of nickel, cobalt, or iron, rare earth alloys, or ferritic metal oxides.

6. The method according to claim 1 wherein the nano-structures comprise nanofibers, nanoparticulates, and/or beaded nanofibers.

7. The method according to claim 1 wherein the preceramic polymer precursor includes carbon-based fibers.

8. The method according to claim 1 further including providing a substrate and processing the dope by electrospraying, wherein the step of electrospraying comprises depositing a coating with the nano-structures on the substrate, and wherein the step of post-processing includes using one or more of heat, pressure, atmosphere, and radiation to convert the carbon- or silicon-based polymer precursors to a final desired form in the nano-structure material such that the protective shield is provided as a coated substrate with directed energy and EMI protection.

9. The method according to claim 1 including processing the dope by electrospinning, wherein the step of electrospinning is performed to prepare a nonwoven mat, and wherein the step of post-processing includes using one or more of heat, pressure, atmosphere, and radiation to convert the precursors to a final desired form in the nano-structure material of the nonwoven mat.

10. The method according to claim 9 further including incorporating the nano-structure material into a composite structure to provide the protective shield as a composite with integral directed energy and EMI protection.

11. The method according to claim 1 wherein the dope comprising blends of the preceramic polymer precursor to metallic precursor range from about 50/50 to about 99/1 by weight percent of the preceramic polymer and metallic precursors.

12. The method according to claim 11 wherein the dope comprising blends of the preceramic polymer precursor to metallic precursor range from about 75/25 to about 95/5 by weight percent of the preceramic polymer and metallic precursors.

13. The method according to claim 1 wherein the protective shield comprises a shield body that protects at least one electrical component at least partially enclosed within a housing, and including locally concentrating a magnetic phase in at least one portion of the shield body to enhance a relative magnetic strength in the at least one portion of the shield body relative to a remaining portion of the shield body.

14. The method according to claim 1 wherein the weight percentage range is from about 90/10 to 99/1.

15. A protective shield to protect an aircraft component from EMI or energy bursts comprising:
a shield body comprising a coated substrate or an integrated composite formed from a nano-structure material that includes a uniformly distributed base metal, and wherein a weight percentage range in the shield body is about 75/25 to about 99/1 weight percent of carbon-based or silicon-based nano-structure to magnetic nano-structure.

16. The protective shield according to claim 15 wherein the nano-structures are nanofibers, nanoparticulates, and/or beaded nanofibers.

17. The protective shield according to claim 16 wherein the nano-structures are electrospun or electrosprayed nano-structures.

18. The protective shield according to claim 15 wherein the nano-structure material is formed from a dope formed from a combination of a carbon-based or silicon-based preceramic polymer precursor and a metallic precursor.

19. The protective shield according to claim 18 wherein the preceramic polymer precursor is an inorganic polymer, and wherein the metallic precursor is a ferromagnetic metal or alloy.

20. The protective shield according to claim 19 wherein the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof and wherein the magnetic metal is nickel, cobalt, iron, alloys of nickel, cobalt, or iron, rare earth alloys, or ferritic metal oxides.

21. The protective shield according to claim 15 wherein the shield body includes a locally concentrated magnetic phase in at least one portion to enhance a relative magnetic strength of the at least one portion relative to a remaining portion of the shield body.

22. The protective shield according to claim 15 wherein the weight percentage range is from about 90/10 to 99/1.

23. An aircraft component comprising:
a housing;
at least one electrical component at least partially enclosed within the housing; and
a protective shield to protect the electrical component from EMI or energy bursts, wherein the protective shield comprises a shield body comprising a coated substrate or an integrated composite formed from a nano-structure material that includes a uniformly distributed base metal, wherein a weight percentage range in the shield body is about 75/25 to about 99/1 weight percent of carbon-based or silicon-based nano-structure to magnetic nano-structure.

24. The aircraft component according to claim 23 wherein the nano-structures are electrospun or electrosprayed nano-structures.

25. The aircraft component according to claim 24 wherein the nano-structure material is formed from a dope formed from a combination of a carbon-based or silicon-based preceramic polymer precursor and a metallic precursor, and wherein the silicon-based preceramic polymer precursor is an inorganic polymer, and wherein the metallic precursor is a ferromagnetic metal or alloy.

26. The aircraft component according to claim 25 wherein the inorganic polymer is at least one of polycarbosilanes, polysilazanes, polysiloxanes, polycarbosilazanes, polycarbosiloxanes, polysilsesquioxanes as well as metal-modified polymers of carbosilanes, silazanes, siloxanes, carbosilazanes, carbosiloxanes, or combinations thereof and wherein the magnetic metal is nickel, cobalt, iron, alloys of nickel, cobalt, iron, rare earth alloys, or ferritic metal oxides.

27. The aircraft component according to claim 23 wherein the shield body includes a locally concentrated magnetic phase in at least one portion to enhance a relative magnetic strength of the at least one portion relative to a remaining portion of the shield body.

28. The aircraft component according to claim 23 wherein the weight percentage range is from about 90/10 to 99/1.

* * * * *